(12) United States Patent
Tramm et al.

(10) Patent No.: US 10,010,002 B2
(45) Date of Patent: Jun. 26, 2018

(54) ANTI-THEFT INSERT FOR UNDERGROUND ENCLOSURE

(71) Applicant: Hubbell Incorporated, Shelton, CT (US)

(72) Inventors: Paul Steven Tramm, Knoxville, TN (US); John Thomas Polk, Townsend, TN (US); Charles Cramer, Kerrville, TX (US)

(73) Assignee: Hubbell Incorporated, Shelton, CT (US)

( * ) Notice: Subject to any disclaimer, the term of this patent is extended or adjusted under 35 U.S.C. 154(b) by 0 days. days.

(21) Appl. No.: 15/349,252

(22) Filed: Nov. 11, 2016

(65) Prior Publication Data

US 2017/0135232 A1 May 11, 2017

Related U.S. Application Data

(60) Provisional application No. 62/254,149, filed on Nov. 11, 2015.

(51) Int. Cl.
| | |
|---|---|
| *H05K 5/02* | (2006.01) |
| *E05B 65/00* | (2006.01) |
| *H02G 9/06* | (2006.01) |
| *H05K 5/03* | (2006.01) |

(52) U.S. Cl.
CPC ....... *H05K 5/0208* (2013.01); *E05B 65/0089* (2013.01); *H02G 9/06* (2013.01); *H05K 5/03* (2013.01)

(58) Field of Classification Search
CPC .................................................. H05K 5/0208
USPC ........................................................ 174/559
See application file for complete search history.

(56) References Cited

U.S. PATENT DOCUMENTS

| | | | |
|---|---|---|---|
| 2008/0150750 A1 | 6/2008 | Parris et al. | |
| 2012/0231657 A1* | 9/2012 | Bouse | H02G 3/185 439/535 |
| 2013/0000365 A1 | 1/2013 | Walker | |
| 2015/0263502 A1 | 9/2015 | Tipton et al. | |

OTHER PUBLICATIONS

PCT/US2016/061514 International Search Report and Written Opinion dated Mar. 13, 2017 (13 pages).

* cited by examiner

*Primary Examiner* — Dhirubhai R Patel
(74) *Attorney, Agent, or Firm* — Michael Best & Friedrich, LLP

(57) ABSTRACT

A utility housing includes an enclosure having a plurality of walls and a central opening for receiving a utility component. An insert is configured to be positioned in the central opening and has a plurality of insert side walls comprising a first insert side wall and a second insert side wall at least partially defining a central region. A first flange extends from the first insert side wall into the central region and a second flange extends from the second insert side wall into the central region. A removable cover is configured to be placed over the insert. A removable lid is configured to connect to the enclosure.

21 Claims, 5 Drawing Sheets

ANTI-THEFT INSERT FOR UNDERGROUND ENCLOSURE

RELATED APPLICATION(S)

This application is based on U.S. Provisional Application Ser. No. 62/254,149, filed Nov. 11, 2015, the disclosure of which is incorporated herein by reference in its entirety and to which priority is claimed.

FIELD

Various exemplary embodiments relate to the field of utility enclosures, for example to anti-theft devices for in-ground utility enclosures.

BACKGROUND

Utility enclosures are located throughout residential and commercial areas to provide housing and access to utility lines, such as electrical, communication, cable, phone, water, or gas lines or other components used in utility transmissions. Areas around connection points, taps, splices, or other utility junctions are typically provided with an enclosure. Enclosures can be positioned above ground, buried underground, or any combination thereof. The space inside the enclosure can protect the utility line and allow access and room for service or maintenance at the enclosures location.

Enclosures are provided with removable covers, panels or other forms of openings to provide access to the interior. Theft, vandalism, and tampering are common problems with utility lines and enclosures. In certain instances, therefore, it is desirable to prevent or deter unwanted access to the interior of such enclosures.

SUMMARY

According to various exemplary embodiments, a utility housing includes an enclosure having a plurality of walls and a central opening for receiving a utility component. An insert is configured to be positioned in the central opening and has a plurality of insert side walls comprising a first insert side wall and a second insert side wall at least partially defining a central region. A first flange extends from the first insert side wall into the central region and a second flange extends from the second insert side wall into the central region. A removable cover is configured to be placed over the insert. A removable lid is configured to connect to the enclosure.

According to another exemplary embodiment, a utility housing includes an insert having a plurality of side walls comprising a first insert side wall and a second insert side wall at least partially defining a central region. A first flange extends from the first insert side wall into the central region and a second flange extends from the second insert side wall into the central region. The insert includes an aperture configured to receive a fastener to anchor the insert to a surrounding structure. A removable cover is configured to be placed over the insert. A locking interface is configured to secure the cover to the insert.

Another exemplary embodiment is directed to a method of securing a utility component. An insert is placed into a utility enclosure, where the insert includes a plurality of side walls having a first insert side wall and a second insert side wall at least partially defining a central region. A first flange extends from the first insert side wall into the central region and a second flange extends from the second insert side wall into the central region and the insert includes an aperture. A fastener is inserted through the aperture and into the utility enclosure. A cover si placed over the insert and a lid is placed over the utility enclosure.

BRIEF DESCRIPTION OF THE DRAWINGS

The aspects and features of various exemplary embodiments will be more apparent from the description of those exemplary embodiments taken with reference to the accompanying drawings, in which.

DETAILED DESCRIPTION OF EXEMPLARY EMBODIMENTS

Figure 1:
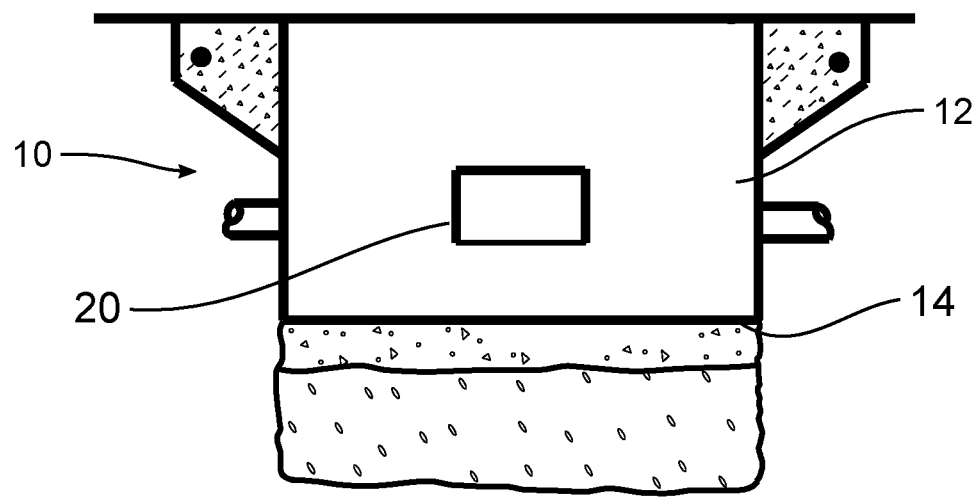
FIG. 1 is a front view of an exemplary enclosure.
Figure 2:
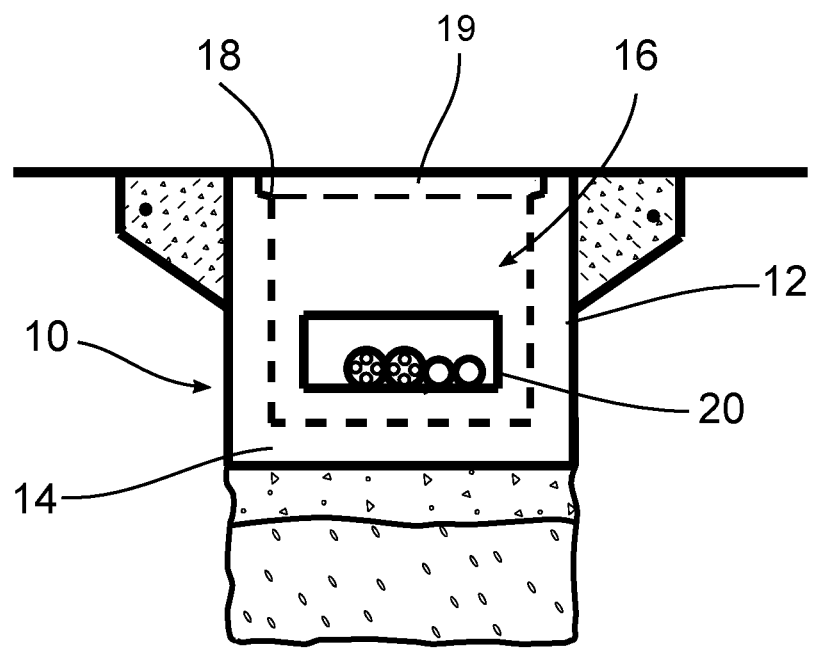
FIG. 2 is a is a side view of the enclosure of FIG. 1.

FIGS. 1 and 2 show an exemplary embodiment of an enclosure 10 having a plurality of connected walls 12 and a bottom 14 surrounding a central opening 16 represented by the dashed lines in FIG. 2. A rim 18 extends around the walls 12 to receive a lid 19. The one or more walls 12 can include one or more conduit openings 20. Cables, pipes, or other utility connections can be passed through the conduit openings 20 and into the central opening 16. The enclosure can be reinforced with steel and/or concrete as would be understood by one of ordinary skill in the art. Different types of lids, including metal, concrete, polymer, polymer-concrete, or lids of other suitable materials may be used. The illustrated exemplary vault enclosure 10 is made of concrete. Other suitable types of enclosures can be used, including pedestals and boxes made from concrete, polymer-concrete, polymer or other suitable materials. Different sizes, shapes, and configurations of boxes can be used depending on the location, utility component, strength requirements, or other factors.

Figure 3:
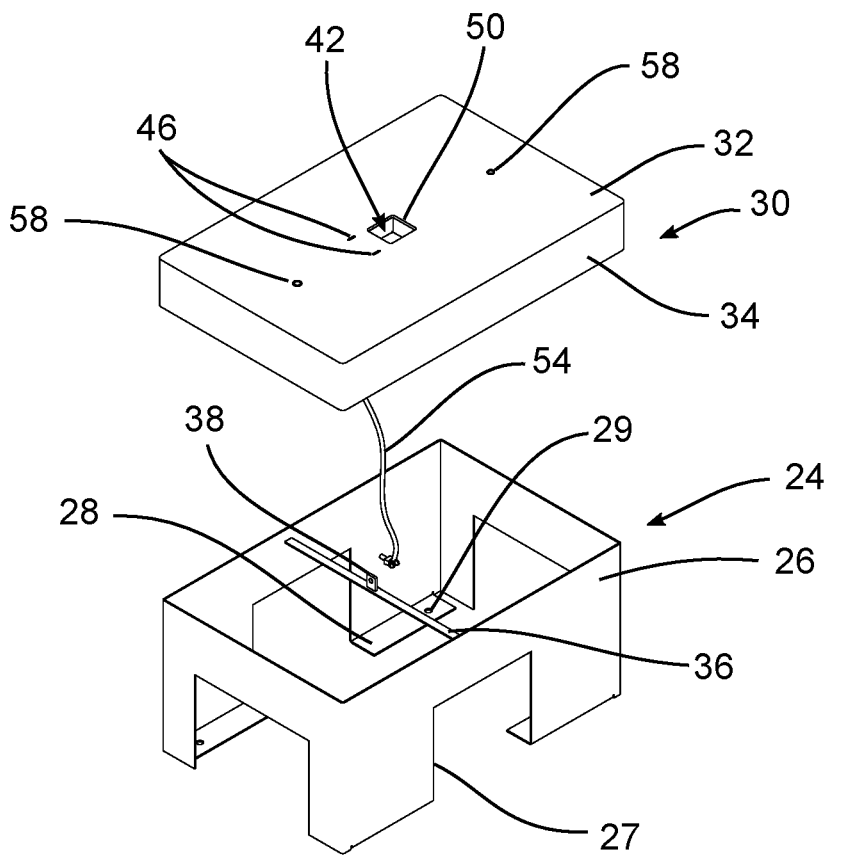
FIG. 3 is a perspective, exploded view of an exemplary enclosure, insert, and cover.
Figure 3:
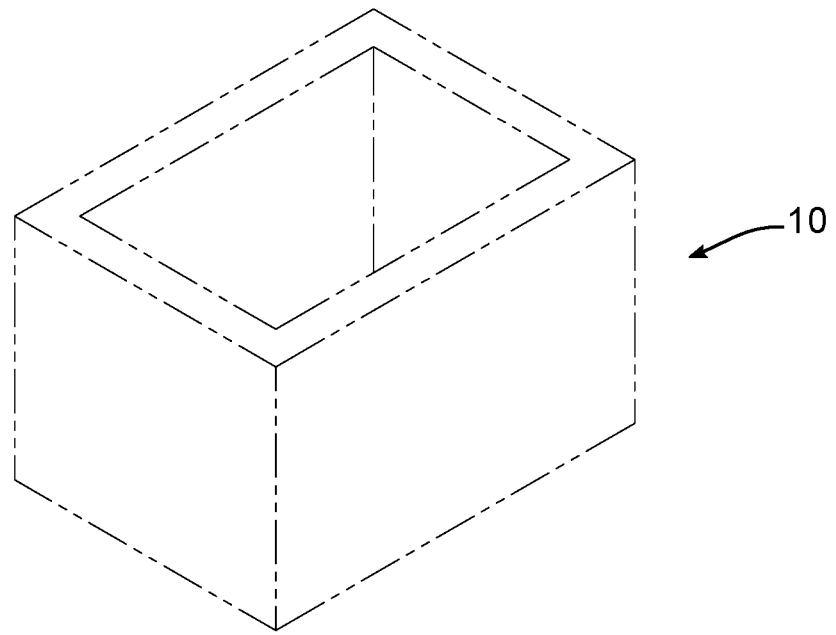

FIG. 3 shows an exemplary embodiment of an insert 24 that can be used in connection with the enclosure 10, or with other utility enclosures. The insert 24 is positioned in the central opening 16. In an exemplary embodiment the insert 24 is made from metal, for example steel, although other suitable materials can be used. The insert 24 has a plurality of side walls 26 surrounding a central region. As shown, four walls 26 are used in a rectangular configuration. In various exemplary embodiments, any number or combination of rectilinear or curvilinear sides may be used, including walls that are configured to define a curvilinear (for example circular or oval) shape where different regions of the curved configuration are considered different walls.

One or more of the side walls 26 can include an opening 27 that is positioned so that utility connections and components can be inserted into the central region of the insert 24. The illustrated embodiment of FIG. 3 shows four rectilinear openings 27, with one opening positioned substantially in the middle of each side wall 26. The size, shape, number, and position of the openings 27, however, can be varied as needed.

In an exemplary embodiment, one or more flanges 28 extend from one or more side walls 26 into the central region. The illustrated embodiment of FIG. 3 shows four flanges 28, with two flanges 28 extending from a first side wall 26 and two flanges 28 extending from an opposite, second side wall 26. The flanges 28 are shown as rectangular and are positioned adjacent either sides of an opening 27. Any number of flanges 28 may be used, including a single discrete flange or a single continuous flange. The size, shape, number, and position of the flanges 28 can be altered or varied as required. For example, the location of the flanges 28 can be altered so that they extend from the other side walls 26 positioned at the ends of the central region or from all the side walls 26.

Figure 4:
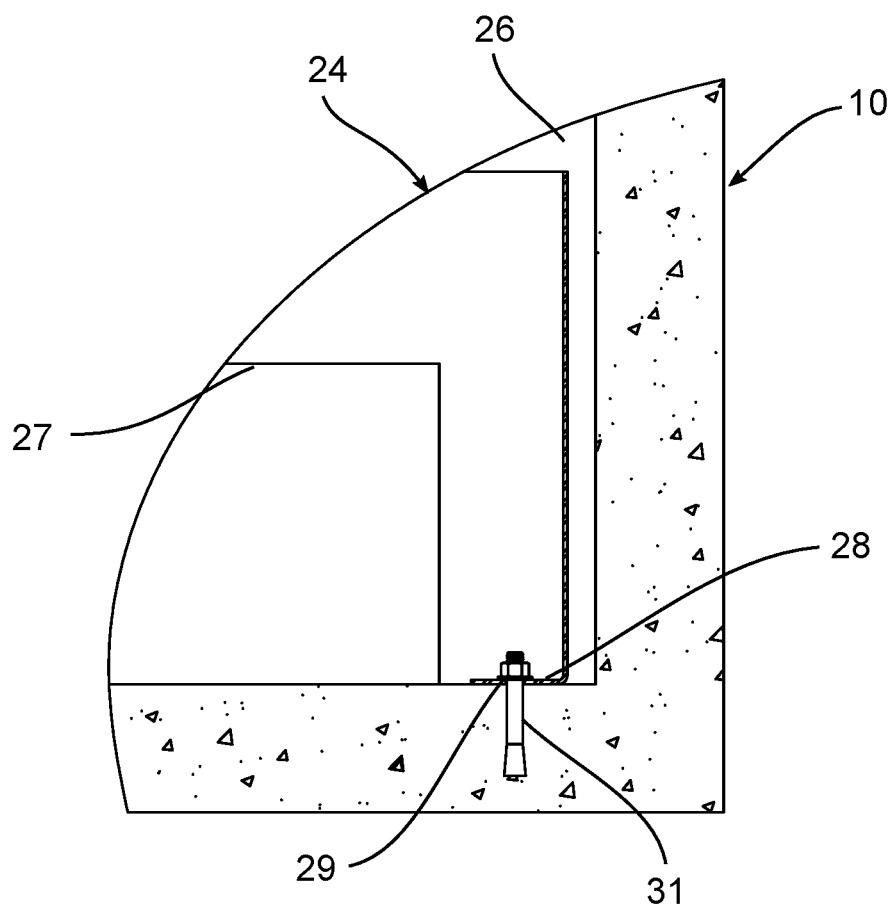
FIG. 4 is a partial, enlarged view of an exemplary enclosure and insert showing a fastener connection.

In various exemplary embodiments, the insert 24 includes one or more apertures that are configured to receive a fastener that anchors or further connects the insert 24 to the enclosure 10 or to another surrounding structure. In the illustrated embodiment of FIG. 3, an aperture 29 is provided in each of the flanges 28. The apertures 29 are located closer to the corner of the side walls 26 on each side than toward the middle of the insert 24. The mechanical fastener can help secure the insert to the enclosure 10. For example, a wedge anchor 31 can extend through the aperture in the flange 28 and into the bottom 14 of the enclosure 10 as shown in FIG. 4. Certain enclosures 10 can have an open bottom, and the mechanical fastener can be secured or inserted into the ground or another surrounding structure. The fastener can be varied depending on the required application. The size, shape, configuration, number, and location of the apertures 29 can be varied, for example to provide more or less support for the connection between the insert 24 and the enclosure 10.

Figure 5:
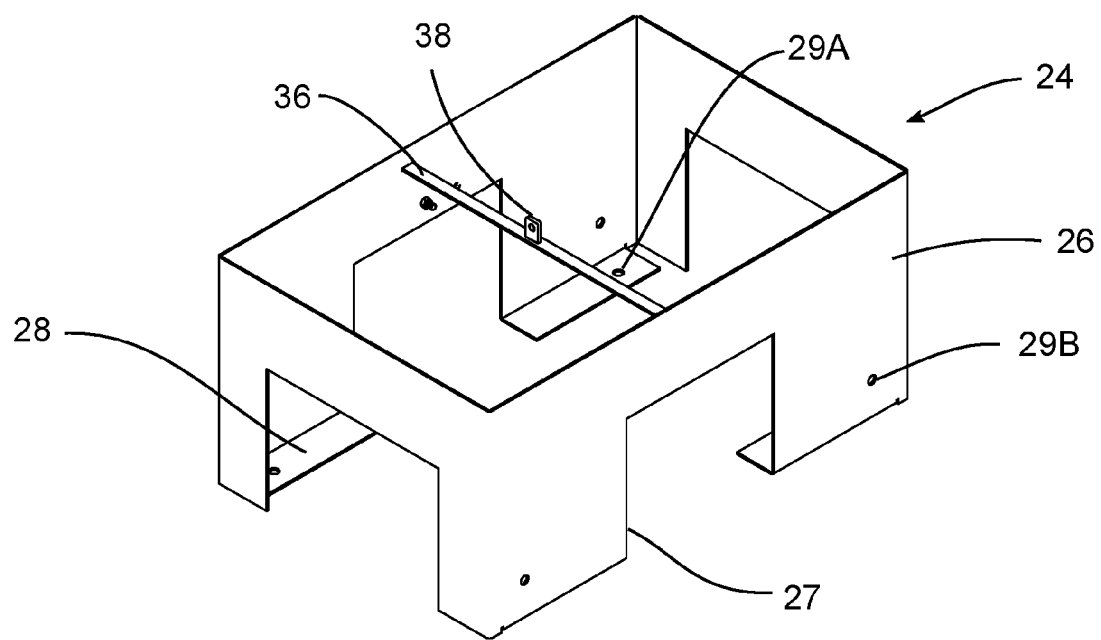
FIG. 5 is a perspective view of another exemplary insert.

In certain embodiments the apertures 29 can be positioned in different locations, for example in the insert side walls 26. FIG. 5 shows an exemplary embodiment of an insert 24 having a first set of apertures 29A positioned in the flanges 28 as discussed above and a second set of apertures 29B positioned in the side walls 26. In the illustrated embodiment, the second set of apertures 29B includes four apertures, with two apertures extending through a first side wall 26 and two apertures extending through an opposite, second side wall 26. The apertures in the second set of apertures 29B are positioned closer to the corner of the side walls 26 on each side than toward the middle of the insert 24. The size, shape, configuration, number, and location of the first and second sets of apertures 29A, 29B can be varied.

As best shown in FIG. 3, a cover 30 is connected to the insert 24. The cover 30 includes a top wall 32 and one or more side walls 34 extending from the top wall 32. When the cover 30 is placed on or over the insert 24 the side walls 34 are long enough to extend over at least a portion of the insert side walls 26. In an exemplary embodiment, the cover 30 is configured to limit access to the interior of the insert and prevent or limit the ability to pry the cover 30 from the insert 24. For example, the cover side walls 34 can be adjacent and/or touching the insert side walls 26. The cover side walls 34 can also extend over the insert 24 down into the enclosure 10 a sufficient depth so that a person would not be able to position a tool to attempt to pry the cover 30 from the insert 24. One of ordinary skill in the art would understand the size requirements needed for different tools to remove or pry the cover 30, for example based on size and weight of the cover 30. Other styles and configurations of covers can also be used with the insert 24.

Figure 6:
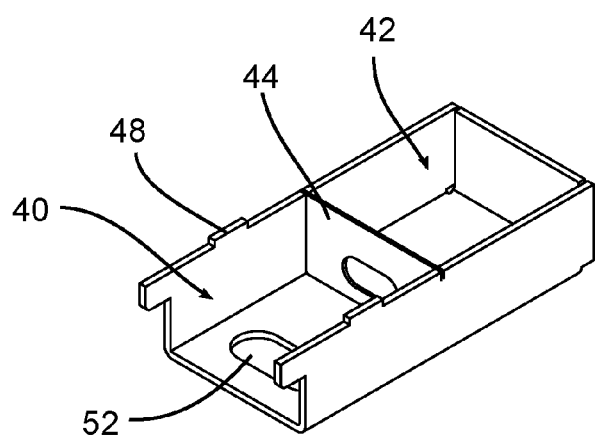
FIG. 6 is a perspective view of an exemplary lock chamber, key chamber, and partition assembly.
Figure 7:
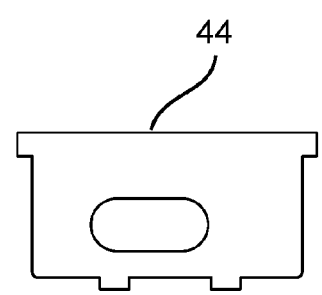
FIG. 7 is a front view of the partition of FIG. 6.

The cover 30 and the insert 24 can be connected through a locking interface. The locking interface can have a first set of components positioned on the insert 24 and a second set of components positioned on the cover 30 that cooperate to help prevent unwanted access to the central region. In an exemplary embodiment, the insert includes a crossbar 36 that extends across the insert 24 and a lock tab 38 extending upward from the crossbar 36. The lock tab 38 includes an opening to receive the shackle of a lock. As best shown in FIGS. 6 and 7, a lock chamber 40 and a key access chamber 42 extend from the bottom surface of the cover 30. A partition 44 separates the lock chamber 40 and the key access chamber 42. The lock chamber 40 and the key access chamber 42 can be formed from a unitary structure. As shown in FIG. 3, the cover 30 includes a first pair of slots 46 that receive a pair of tabs 48 that extend from a wall adjacent the lock chamber 40. The cover 30 also includes an opening 50 that provides access to the key access chamber 42, for example a square or rectangular opening. In an exemplary embodiment, the lock and key access chambers 40, 42 can be welded to the cover, although other materials and connections can be used.

The lock chamber 40 has an open first end to receive a lock, for example a disc-shaped lock. The top of the lock chamber 40 is covered by the bottom surface of the cover 30 to form a hidden aperture, preventing unauthorized access to the lock. When the lock is positioned in the lock chamber 40, the key receiving portion of the lock extends through or is accessible through the partition 44 and the key access chamber 42. The bottom of the lock chamber 40 has a slot 52 that aligns with the path of the disc-lock shackle. When the cover 30 is placed on the insert 24, the lock tab 38 is received in the slot 52 so that closure of the lock inserts the lock shackle through the opening 39 in the lock tab 38, securing the cover 30 to the insert 24.

In various exemplary embodiments, the cover 30 can include a grounding feature 54 and one or more lifting openings 58. As shown in FIG. 3, the grounding feature 54 can include a grounding ribbon and a grounding lug that connects to the insert 24. The lifting openings 58 extend partially into the cover 30 or entirely through the cover 30 and are configured to receive a lifting device. A pair of lifting openings 58 can be used with a pair of lifting devices to allow a user to pull the cover 30 from the insert 24. The lifting openings 58 are optional and various alternative embodiments can utilize no lifting openings 58, one lifting opening 58, or more than two lifting openings 58. The size, shape, and configuration of the lifting openings 58 can also be varied based on the application and the configuration of the cover 30 and the lifting tool.

Various exemplary embodiments are also directed to a method of making and installing an insert 24 as described above. According to one exemplary embodiment, the side walls 26 and flanges 28 are made from a single piece of material that is folded to create the side walls 26 and the flanges. The openings 27 in the side walls 26 can be formed with the single piece or subsequently formed, for example through cutting or stamping. The apertures 29 are formed subsequent to the single piece, for exampling through stamping or drilling. A pair of adjacent side walls 26 can be connected together, for example through one or more mechanical fasteners, welds, or other suitable connection methods depending on the material. In other embodiments, the side walls 26 and flanges 28 can be formed from two or more separate components that are connected together. The cross bar 36 is connected to a pair of side walls 26, for example through welding.

During installation, the insert 24 is placed in an enclosure 10. The insert 24 can be used with new installations, prior to the introduction of a utility component or in retro-fit applications where the utility components are already positioned in the enclosure 10. After the insert 24 is placed in the enclosure, the cover 30 can be connected to the insert 24 and secured using the locking interface as described herein. The lid 19 is then placed onto the enclosure 10 over the insert 24. In certain exemplary embodiments, the cover 30 can be grounded to the insert 24 by connecting the grounding strap 54 to one of the side walls 26, for example using a fastener.

The illustrated exemplary embodiment shows an enclosure 10 having a recessed lid 19 that rests on an upper surface of the rim 18 so that the top of the lid 19 is substantially flush with the top of the rim 18 and at grade level. As would be understood by one of ordinary skill in the art, different types of lids, including T-top lids, two piece lids, and flat lids could be used with the enclosure and the insert 24 can be modified as needed. Even though the illustrated exemplary embodiment shows a straight wall enclosure 10, one of ordinary skill in the art would understand that different types of enclosures 10, including tapered or flared walls, corrugated or ribbed walls, round enclosures or other types of above and below ground enclosures can be used. One of ordinary skill in the art would also understand that the size, shape, and configuration of the insert 24 and cover 30 can be modified to accommodate the different enclosure 10 and lid 19 combinations.

The foregoing detailed description of the certain exemplary embodiments has been provided for the purpose of explaining the principles of the application and examples of practical implementation, thereby enabling others skilled in the art to understand the disclosure for various embodiments and with various modifications as are suited to the particular use contemplated. This description is not necessarily intended to be exhaustive or to limit the application to the exemplary embodiments disclosed. Any of the embodiments and/or elements disclosed herein may be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present application, and are not intended to limit the structure of the exemplary embodiments to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A utility housing comprising:
an enclosure including a plurality of walls and a central opening for receiving a utility component;
an insert positioned in the central opening and having a plurality of insert side walls comprising a first insert side wall and a second insert side wall at least partially defining a central region, wherein a first flange extends from the first insert side wall into the central region and a second flange extends from the second insert side wall into the central region;
a removable cover placed over the insert;
a removable lid connectable to the enclosure; and
a locking interface connecting the cover to the insert to secure the cover in a closed position, wherein the locking interface includes a tab on the insert and a lock chamber on the cover.

2. The utility housing of claim 1, wherein the first insert side wall is opposite the second insert side wall and the first flange extends toward the second flange.

3. The utility housing of claim 1, wherein the insert includes an aperture configured to receive a fastener to anchor the insert to the enclosure.

4. The utility housing of claim 3, wherein the aperture is positioned in the first flange.

5. The utility housing of claim 4, further comprising a second aperture positioned in the second flange.

6. The utility housing of claim 1, wherein the insert includes a first aperture positioned in the first flange and a second aperture positioned in the first insert side wall.

7. The utility housing of claim 1, wherein the removable cover has a top and a cover wall extending from the top, the cover configured to be placed over the insert so that the cover wall surrounds at least a portion of the plurality of insert side walls.

8. The utility housing of claim 1, wherein the enclosure includes a conduit opening and the insert includes an opening in one of the side walls aligned with the conduit opening.

9. The utility housing of claim 1, wherein a locking interface further comprises a crossbar extending from a side wall, wherein the tab extends from the crossbar and includes an opening.

10. A utility housing comprising:
an insert having a plurality of side walls comprising a first insert side wall and a second insert side wall at least partially defining a central region, wherein a first flange extends from the first insert side wall into the central region and a second flange extends from the second insert side wall into the central region, and wherein the insert includes an aperture to receive a fastener to anchor the insert to a surrounding structure;
a removable cover placed over the insert; and
a locking interface for securing the cover to the insert in a closed position,
wherein the locking interface includes a lock chamber extending from the cover to receive a lock, a key access chamber adjacent the lock chamber, a crossbar extending between two of the plurality of side walls, and a lock tab extending from the crossbar and having an opening.

11. The utility housing of claim 10, wherein the lock chamber includes a slot to receive the lock tab and a shackle of the lock passes through the opening of the lock tab when in the locked position.

12. The utility housing of claim 10, wherein the key access chamber is separated from the lock chamber by a partition.

13. The utility housing of claim 10, wherein the removable cover has a top and a cover wall extending from the top, the cover configured to be placed over the insert so that the cover wall surrounds at least a portion of the plurality of insert side walls and is configured to prevent a tool from prying the cover from the insert.

14. The utility housing of claim 10, wherein the surrounding structure comprises a ground substrate.

15. The utility housing of claim 10, wherein the surrounding structure comprises a utility enclosure.

16. The utility housing of claim 10, wherein the aperture is positioned in the flange.

17. The utility housing of claim 16, wherein a second aperture is positioned in the first insert sidewall.

18. A method of securing a utility component comprising:
placing an insert into a utility enclosure, the insert comprising a plurality of side walls comprising a first insert side wall and a second insert side wall at least partially defining a central region, wherein a first flange extends from the first insert side wall into the central region and a second flange extends from the second insert side wall into the central region, and wherein the insert includes an aperture;
inserting a fastener through the aperture and into the utility enclosure;
placing a cover over the insert;
placing a lid over the utility enclosure; and
securing the cover to the insert with a lock, wherein the cover includes a lock chamber and the lock is secured to a tab on the insert.

19. The method of claim 18, wherein the aperture is positioned in the flange and the fastener is inserted into a bottom wall of the utility enclosure.

20. The method of claim 18, wherein the aperture is positioned in one of the plurality of insert side walls and the fastener is inserted into a side wall of the utility enclosure.

21. The method of claim 18, wherein a first aperture is positioned in the flange and a second aperture is positioned in one of the plurality of insert side walls, and the fastener is selectively inserted through the first aperture or the second aperature.

* * * * *